United States Patent [19]
Oldfield

[11] Patent Number: 5,734,176
[45] Date of Patent: Mar. 31, 1998

[54] IMPEDANCE CONTROLLED TEST FIXTURE FOR MULTI-LEAD SURFACE MOUNTED INTEGRATED CIRCUITS

[75] Inventor: William W. Oldfield, Redwood City, Calif.

[73] Assignee: Wiltron Company, Morgan Hill, Calif.

[21] Appl. No.: 607,119

[22] Filed: Feb. 26, 1996

[51] Int. Cl.$^6$ .................................. H01L 23/58
[52] U.S. Cl. .................... 257/48; 257/785; 324/762; 361/776
[58] Field of Search .................... 257/785, 773, 257/728, 727, 48; 324/761, 762; 361/776, 769; 438/15

[56] References Cited

U.S. PATENT DOCUMENTS

| | | | |
|---|---|---|---|
| 4,922,376 | 5/1990 | Pommer et al. | 361/386 |
| 5,434,452 | 7/1995 | Higgins, III | 257/773 |

OTHER PUBLICATIONS

"Test Socket Performance Handbook" 1st Edition by David A. Johnson and David L. Senum (1994).
"Membrane Probe Speeds Digital and RF IC Testing", Microwave & RF, Jan. 1995, pp. 135–139.

Primary Examiner—Jerome Jackson
Assistant Examiner—Nathan K. Kelley
Attorney, Agent, or Firm—Fliesler, Dubb, Meyer & Lovejoy, LLP.

[57] ABSTRACT

A test fixture for testing an integrated circuit having leads. The test fixture includes a substrate with top and bottom surfaces and holes extending from the top to the bottom surface. The integrated circuit is mounted on the top surface with each lead located above each hole. Contact flippers are located on the top surface of the substrate, with the contact flippers extending between the leads and the holes. Shuttle springs are located along the bottom surface and extend across the holes. Shuttles are inserted into each hole so that upon contact by the leads against the contact flippers, the shuttles move downward and against the upward pressure from the shuttle springs to provide a resilient connection between the test fixture and the integrated circuit.

14 Claims, 5 Drawing Sheets

IMPEDANCE CONTROLLED TEST FIXTURE FOR MULTI-LEAD SURFACE MOUNTED INTEGRATED CIRCUITS

BACKGROUND OF THE INVENTION

1. Field of the Invention

The present invention generally relates to test fixtures for the testing of surface-mounted microwave integrated circuits. More particularly, the present invention relates to a test fixture that controls impedance associated with testing surface-mounted integrated circuits while simultaneously providing a resilient, self-cleaning connection between the test fixture and the integrated circuit.

2. Description of the Related Art

Designers of test fixtures for testing complex integrated circuits (ICs) have been challenged by a trend in the semiconductor industry to conduct testing of integrated circuits at higher frequencies, including the low microwave frequency range. In the past, the testing of the ICs had been conducted at very low frequencies, typically less than 100 Mhz. At these lower frequencies, connections between the test fixtures and the ICs under test provided accurate testing of the ICs since problems such as inductance and radiation, normally associated with high frequency testing, were avoided. These tests were performed using pin probe cards, with connections between the test fixture and the IC being made with a needle-type pin.

As the frequencies of the ICs moved upward into the low microwave frequencies, the need to make better microwave connections became greater. The needle-type pins were very inductive at high frequencies and also tended to radiate, which detracted from accurate testing of the IC. Designers attempted to improve the test fixtures by making the needles as short as possible, but there remained a limit to how short the needles could be made and still accurately perform the necessary measurements.

Designers have attempted to design a test fixture that would provide a high frequency test connection to the IC that simulates the final application of the IC, that is, a connection to a planar printed circuit (PC) board. There are several problems with this approach. First, the connections between a planar PC board test fixture and the IC do not provide a resilient contact between the leads of an IC and the test fixture. Due to the non-planar configuration of the leads of an IC, a resilient connection between the leads and the test fixture is necessary to provide reliable, consistent contact between the IC and the test fixture.

A second problem with attempting to design a test fixture simulating a planar PC board is that the connections between the test fixture and the IC are not self-cleaning. That is, after many test actuations, the contact surfaces on the test fixture used to connect the test fixture to the leads of the IC may wear down and solder build-up can cause distortion and dramatically reduce the performance of the test fixture.

A third problem with a test connection to a PC board is that impedance control is difficult to maintain.

Johnstech International of Minneapolis, Minn. has provided a test fixture providing a high frequency connection between an IC and a planar PC board or test socket. The test fixture provides a resilient and self-cleaning connection between a device under test and the test fixture, but lacks the simultaneous impedance control. Johnstech uses a device named a "Short Contact" to form the connection between the multiple pins of an IC and the test socket. Prior Art FIG. 1 illustrates the Short Contact 3 used to form a connection between an integrated circuit 1 under test and the Johnstech test socket 2. A problem with Short Contact 3 is that the rubber used to provide resiliency for Short Contact 3 eventually deteriorates and so does the resiliency of the contact with the leads of the IC. Further, the Short Contact 3 does not provide sufficient impedance control between the test socket 2 and the pin 4 of the IC.

A need therefore remains to provide a planar PC board test fixture maintaining impedance control while simultaneously providing resilient, self-cleaning connections to the IC under test.

SUMMARY OF THE INVENTION

The present invention provides a test fixture that maintains impedance control while simultaneously providing a resilient and self-cleaning connection between the surface-mounted integrated circuit under test and the test fixture.

The present invention includes a test fixture for testing integrated circuits having leads. The test fixture comprises a substrate with top and bottom surfaces and holes extending from the top surface to the bottom surface. The integrated circuit is mounted on the top surface of the substrate with a lead being located above each hole. Contact flippers are located on the top surface, with the contact flippers extending between the leads and the holes. Shuttle springs are located along the bottom surface and extend across the holes. Shuttles are inserted into each hole so that upon contact by the leads against the contact flippers, the shuttles move downward and against the upward pressure from the shuttle springs.

The substrate has a coplanar waveguide (CPW) located on the top surface of a CPW substrate for receiving a signal and directing the signal to a lead. The CPW is composed of a CPW trace having a proximal CPW trace end, a distal CPW trace end, a first CPW side and a second CPW side. The distal CPW trace end is connected to the proximal CPW trace end by the first and second CPW sides. A contact flipper is connected to the proximal CPW trace end.

The CPW is further composed of a first gap, with a first width, extending along the length of the first CPW side. A second gap, having a second width, extends along the length of the second CPW side. Along the length of the first and second gaps are ground traces that complete the CPW on the test fixture. The width of the first and second gaps are used to control the impedance of the test fixture.

A further embodiment of the CPW is composed of a CPW with a single gap, either the first gap or the second gap, with a ground trace located along the single gap used and extending along the length of the single gap.

Resilient connections between the leads and the contact flippers are made by the shuttles that move downward and against the upward pressure from the shuttle springs.

The downward movement by the shuttle also causes the contact flippers to move in a horizontal direction relative to the top surface of the substrate to clean the connection.

Other aspects and advantages of the present invention can be seen upon review of the figures, the detailed description, and the claims which follow.

BRIEF DESCRIPTION OF THE DRAWINGS

Further details of the present invention are explained with the help of the attached drawings in which.

DETAILED DESCRIPTION OF THE INVENTION

Figure 1:
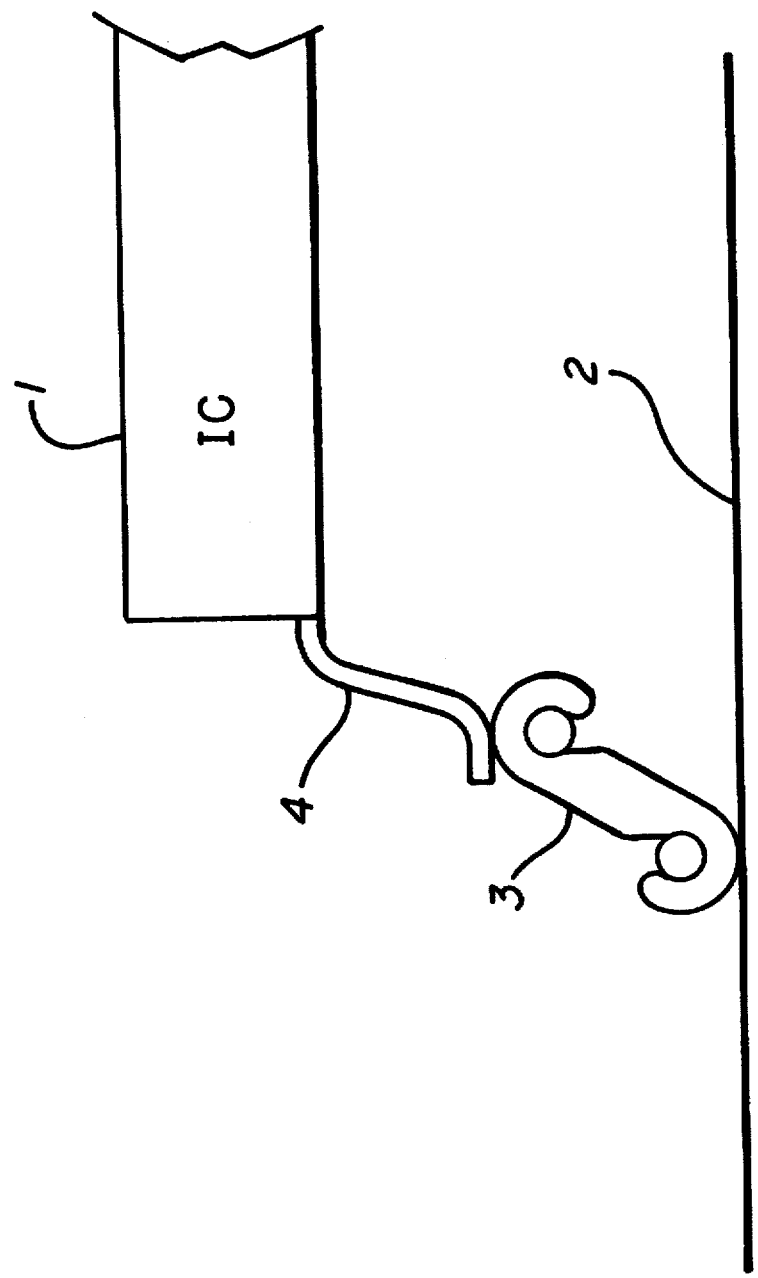
FIG. 1 illustrates a side view of a prior art test fixture connection to an integrated circuit.
Figure 2:
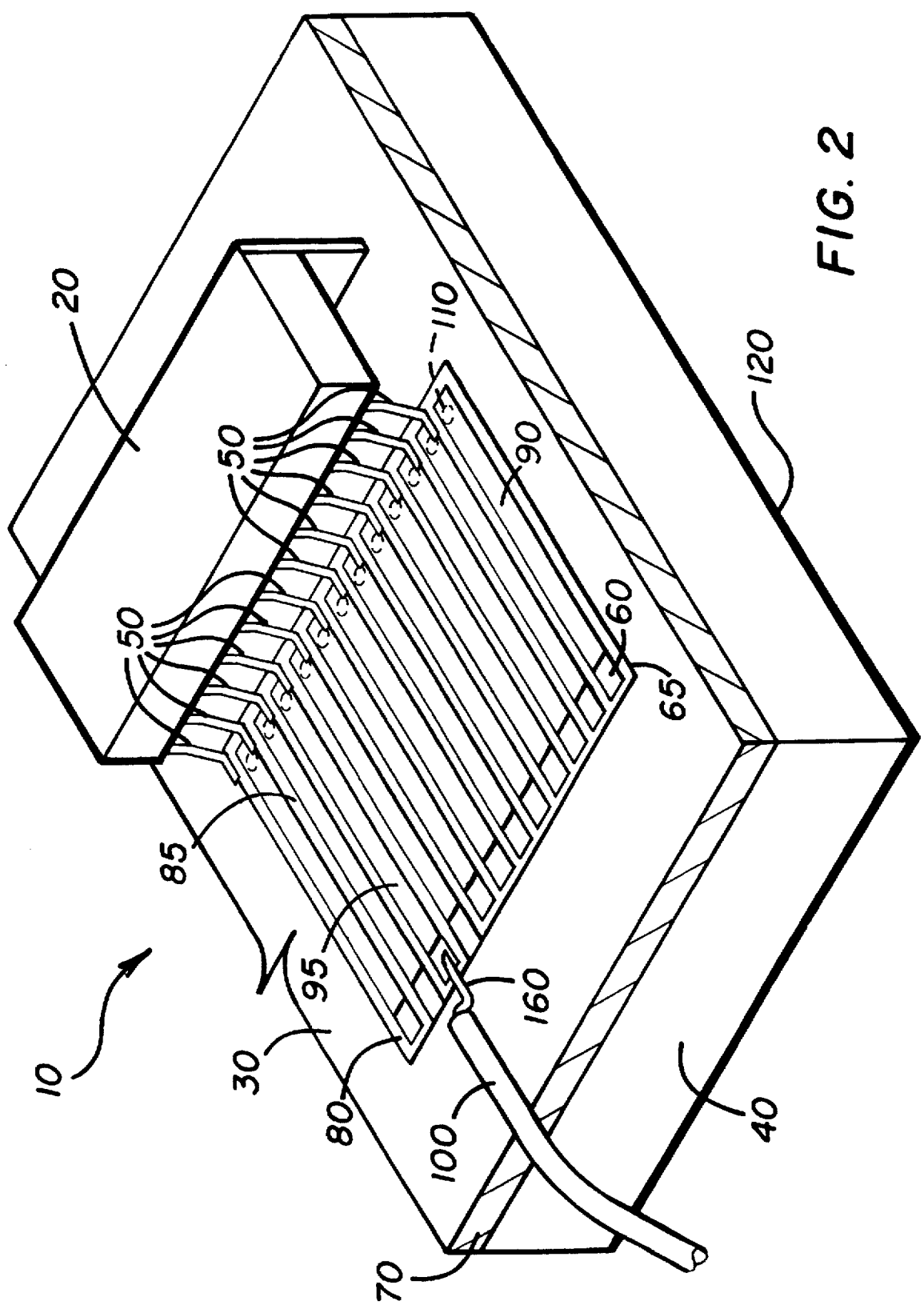
FIG. 2 illustrates a top perspective view of the test fixture of the present.

FIG. 2 illustrates the test fixture 10 of the present invention. An integrated circuit 20 is mounted on top surface 30 of substrate 40. The integrated circuit 20 has a plurality of leads 50 that are in contact with the substrate 40 in order to test the integrated circuit 20. On top surface 30 of substrate 40 are a plurality of traces 60 that are etched into a coplanar waveguide (CPW) substrate 70. Attached to the proximal end 80 of the plurality of traces 60 are a plurality of contact flippers 90 for making contact between the plurality of traces 60 and the plurality of leads 50. While the test fixture 10 of FIG. 1 illustrates a twenty-four lead integrated circuit 20, it should be understood that the actual number of plurality of leads 50, plurality of traces 60, and plurality of contact flippers 90 may be varied and still fall within the scope of the claims provided below.

A coaxial cable 100 with inner and outer conductors (not shown) is connected to one of the plurality of traces 60. The inner conductor 160 of coaxial cable 100 carries a microwave signal (not shown) to one of the plurality of traces 60 that is used to test the integrated circuit 20. The outer conductor (not shown) of coaxial cable 100 is connected to ground plane 65 which surrounds plurality of traces 60. While a coaxial cable 100 is shown in FIG. 2 as the means for transferring the microwave signal to one of the plurality of traces 60, it is understood that different means of transferring the signal to the plurality of traces 60 may be used and still fall within the scope of the claims provided below. A microstrip may be used in another embodiment to transfer the microwave signal to one of the plurality of traces 60, while a coplanar waveguide (CPW) in a second planar printed circuit board may also be used in a further embodiment. Other equivalent means may also be used that transfer the signal to the plurality of traces 60.

A CPW (not shown) is formed on the CPW substrate 70 to carry a microwave signal (not shown) from the inner conductor 160 of coaxial cable 100 to one of the plurality of leads 50. The CPW is formed by one of the plurality of traces 60 (CPW trace 95 in FIG. 2) etched into the CPW substrate 70. Although the CPW trace 95 is used to carry the signal (not shown) as depicted in FIG. 2, it should be understood that any one of the plurality of traces 60 may be used to form a CPW. Further details of the CPW will be described with reference to FIG. 4 below.

Below the plurality of leads 50, at the distal end 85 of the plurality of contact flippers 90, are a plurality of holes 110 extending from the top surface 30 of the substrate 40 to the bottom surface 120. Each one of the plurality of holes 110 contains one of a plurality of shuttles (not shown) whose structure and operation will be described with reference to FIG. 5 below.

Figure 3:
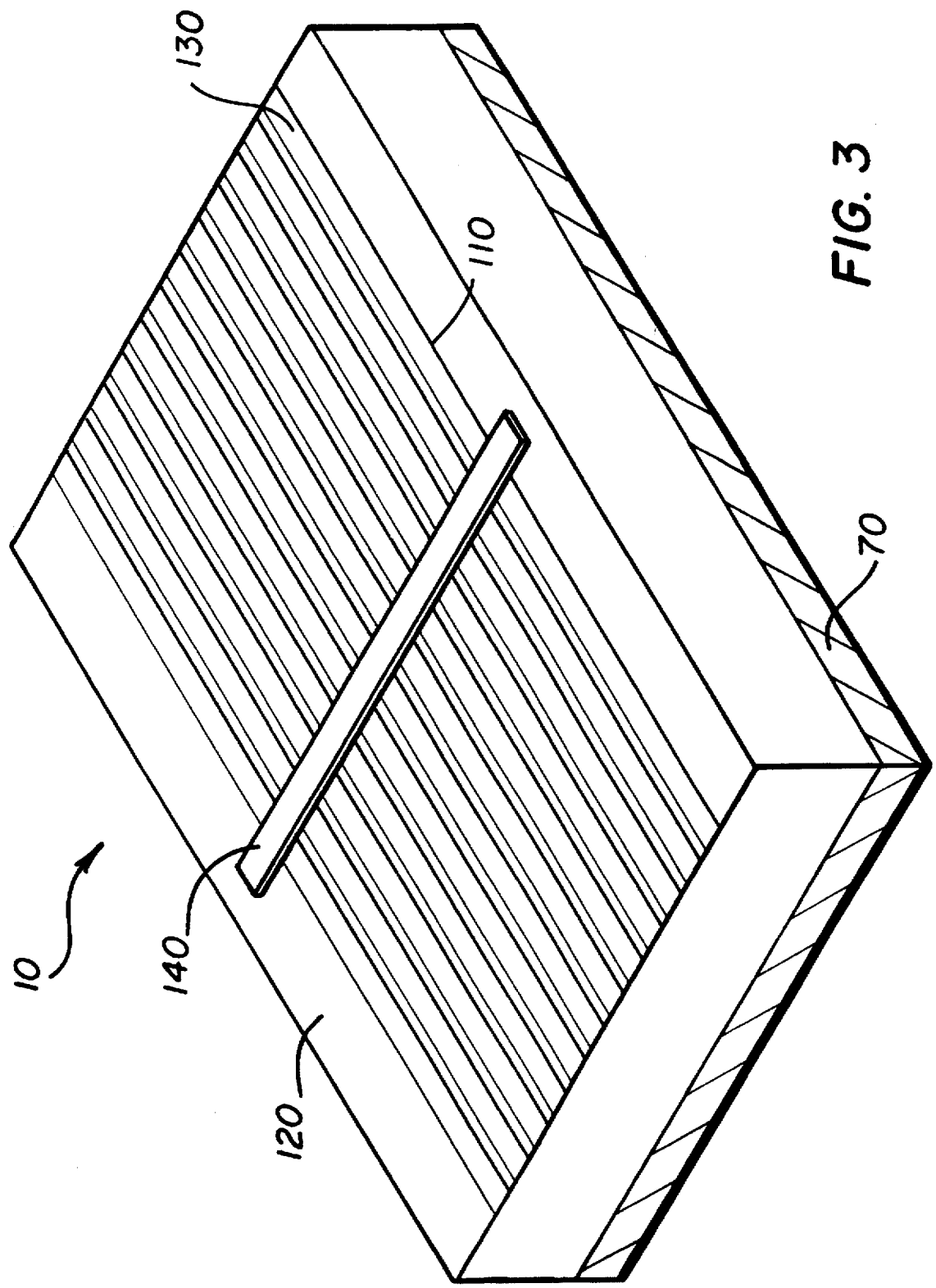
FIG. 3 illustrates a bottom perspective view of the test fixture of the present invention.

FIG. 3 illustrates a bottom perspective view of the test fixture 10 of the present invention. A plurality of shuttle springs 130 are located along the bottom surface 120 of the test fixture 10. The plurality of shuttle springs 130 are composed of a flexible copper metal, but any flexible type of material may be substituted therefor to achieve support for each one of the plurality of shuttles (not shown) inserted into each one of the plurality of holes (not shown). The strength of each one of the plurality of shuttle springs 130 is stronger than the strength of each one of the plurality of contact flippers 90 shown in FIG. 1 so that downward pressure exerted on each one of the plurality of shuttle springs 130 will produce an upward pressure by the plurality of shuttle springs 130. The plurality of shuttle springs 130 are parallel to the plurality of contact flippers 90 and extend over the plurality of holes 110. A support bar 140 is attached to the bottom surface 120 and extends across the plurality of shuttle springs 130 to support the plurality of shuttle springs 130.

Figure 4:
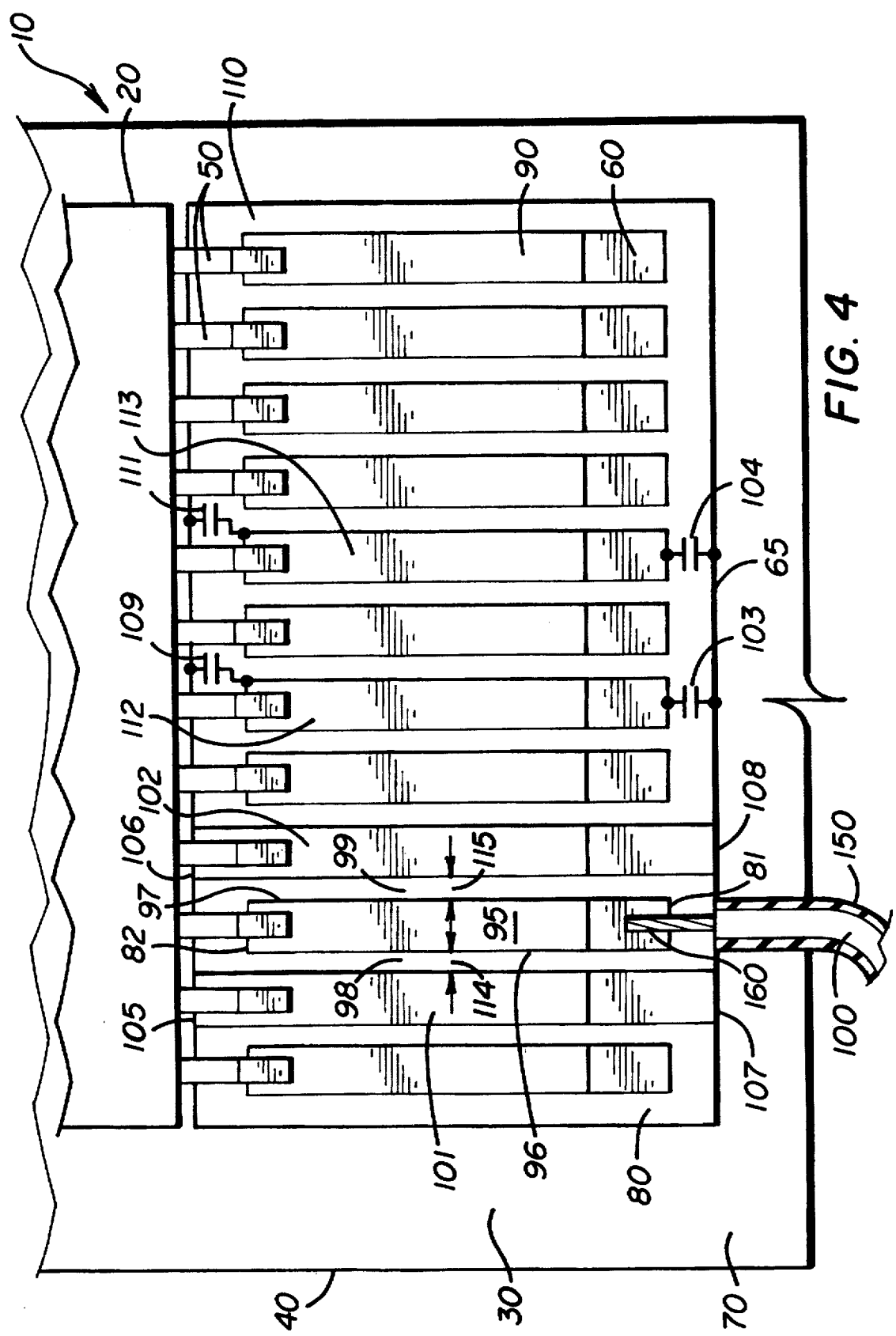
FIG. 4 illustrates a top view of the test fixture of the present invention.

FIG. 4 illustrates a top view of the test FIG. 10 of the present invention. The integrated circuit 20 is mounted on top surface 30 of substrate 40. The plurality of leads 50 of integrated circuit 20 are in contact with the plurality of contact flippers 90. The plurality of contact flippers 90, in turn, are attached to the proximal end 80 of a plurality of traces 60 etched into the CPW substrate 70. A coaxial cable 100, carrying a microwave signal (not shown) along center conductor 160, is coupled to one of the plurality of traces 60. It should be understood that the coaxial cable 100 may be connected to any one of the plurality of traces 60 to test the integrated circuit 20. It should be further understood that different means for transferring the microwave signal to one of the plurality of traces 60 may be used, including, but not limited to, a microstrip or a CPW in a second planar printed circuit board. Other equivalent means may also be used that transfer the signal to the plurality of traces 60.

As discussed with reference to FIG. 2, a CPW is formed on the CPW substrate 70. The CPW is formed by using the CPW trace 95 which is one of the plurality of traces 60. It should be understood that a CPW may be composed of any one of the plurality of traces 60. The CPW trace 95 has a proximal CPW trace end 81 and a distal CPW trace end 82. The proximal CPW trace end 81 is connected to the distal CPW trace end 82 by a first CPW side 96 and a second CPW side 97. A first gap 98, having a first width 114, extends along the length of the first CPW side 96 and a second gap 99, having a second width 115, extends along the length of the second CPW side 97. Ground traces 101 and 102 are located along the length of the first gap 98 and second gap 99, respectively.

The combination of the CPW trace 95 located next to a first 98 and second 99 gap, which in turn are adjacent to ground traces 101 and 102, form the CPW for the CPW trace 95. It should be understood that this combination may form a CPW from any one of the plurality of traces 60 of the fixture 10. It should be further understood that a CPW may be formed, in another embodiment, using a single gap, either the first 98 or second 99 gap, with a ground trace 101, 102 located along the single gap used and extending along the length of the single gap.

The ground traces 101 and 102 are formed by connecting these ones of a plurality of traces 60 to the ground plane 65 at locations referenced by numerals 105, 106, 107 and 108. Another manner of creating the ground traces is by connecting several of the plurality of traces 60 to the ground plane 65 via capacitors 103, 104, 109 and 111 which effectively form a second set of ground traces 112 and 113.

It is important to note that impedance for the fixture 10 is controlled by the first 114 and second 115 widths of the first 98 and second 99 gaps, respectively.

The outer conductor 150 of the coaxial cable 100 is also connected to ground plane 65 which surrounds the plurality of traces 60. The plurality of leads 50 may be configured as either a Radio Frequency (RF), ground, digital or bias connection.

Figure 5:
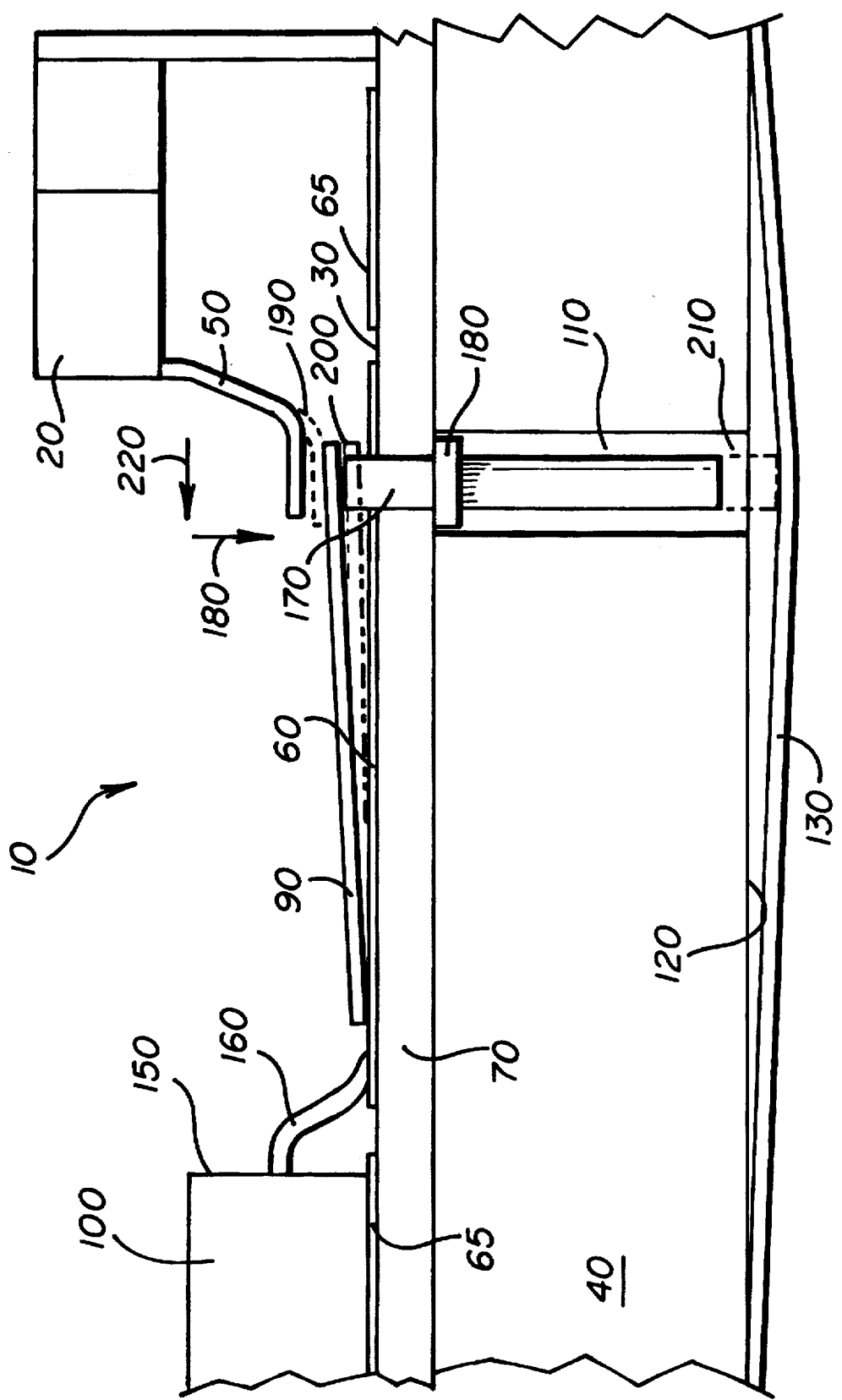
FIG. 5 illustrates a side view of the test fixture of the present invention.

FIG. 5 illustrates a side view of the test fixture 10 of the present invention. The integrated circuit 20 is mounted on top surface 30 of substrate 40, with plurality of leads 50 in contact with plurality of contact flippers 90. The plurality of contact flippers 90 are attached to a plurality of traces 60 etched into the CPW substrate 70. A coaxial cable 100, or other signal transferring means, carrying a microwave signal (not shown) along center conductor 160, is coupled to one of the plurality of traces 60. The outer conductor 150 of coaxial cable 1 00 is connected to the ground plane 65 which surrounds the plurality of traces 60. A plurality of holes 110 are located below each one of the plurality of leads 50. Inserted into each one of the plurality of holes 110 is one of a plurality of shuttles 170. Each one of the plurality of shuttles 170 is typically made of plastic, however, metallic structures, or partially metallic structures, may be used. Toward the top of the plurality of holes 110 is a shuttle stop 180 that sets the distance that each one of the plurality of shuttles 170 protrudes above the top surface 30 of the substrate 40.

In another embodiment, each one of the plurality of shuttles 170 has a constant diameter and no shuttle stop 180. The distance that each one of the plurality of shuttles 170 protrudes above the top surface 30 is controlled by the lack of upward pressure exerted by each one of the plurality of shuttle springs 130.

In use, the integrated circuit 20 is mounted on top surface 30 of substrate 40 of test fixture 10. As each one of the plurality of leads 50 moves in a downward direction 180 to a second lead position 190 (shown by dashed lines), each one of the plurality of contact flippers 90 are moved to a second spring position 200 (shown by dashed lines) to thereby move each one of the plurality of shuttles 170 to a second shuttle position 210 (shown by dashed lines). This downward movement 180 causes each one of the plurality of shuttles 170 to come in contact with each one of the plurality of shuttle springs 130 located on the bottom surface 120 of the substrate 40. The downward movement 180 against the shuttle spring 130 causes upward pressure against each one of the plurality of shuttles 170, and in turn, against each one of the plurality of contact flippers 90 to form a resilient connection between each one of the plurality of leads 50 and each one of the plurality of contact flippers 90.

A microwave signal (not shown), being carried by the center conductor 160 of the coaxial cable 100, is sent through one of the plurality of traces 60 etched in CPW substrate 70. This one of a plurality of traces 60 is connected to one of a plurality of contact flippers 90 where the signal is sent to one of the plurality of leads 50 to make an RF connection to the IC 20. Digital, bias and ground (all not shown) connections to the IC 20 may also be made.

The downward movement 180 of each one of the plurality of contact flippers 90 also causes a movement in a horizontal direction 220 of each one of the plurality of leads 50 against each one of the plurality of contract springs 90 to provide a self-cleaning action that maintains the contact, between each one of the plurality of leads 50 and each one of the contact flippers 90, clean.

In other embodiments, the coaxial cable 100 may be replaced by any transferring means that is able to transfer a microwave signal to one of the plurality of traces 60, including, but not limited to, a microstrip or a CPW in a second planar printed circuit board.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A test fixture for testing integrated circuits having a plurality of leads, comprising:

a substrate with top and bottom surfaces and a plurality of holes extending from said top surface to said bottom surface, said integrated circuit being mounted on said top surface with each of said leads being located above one of said holes;

a plurality of contact flippers located on said top surface, each one of said contact flippers extending beneath one of said leads and over one of said holes;

a plurality of shuttle springs located along said bottom surface, each one of said shuttle springs extending across one of said holes; and a plurality of shuttles, each one of said shuttles located in one of said holes for contacting each one of said plurality of leads to each one of said plurality of contact flippers to test said integrated circuit.

2. The test fixture of claim 1 wherein upon contact by said leads on said contact flippers, said shuttles move downward and against upward pressure from said shuttle springs to provide resilient connections between said leads and said contact flippers.

3. The fixture of claim 2 wherein said downward movement by said shuttles cause said contact flippers to move in a horizontal direction relative to said substrate top surface to clean said resilient connections.

4. The fixture of claim 1 further comprising:

a plurality of shuttle stops, each one of said shuttle stops connected to one of said plurality of shuttles and located within one of said holes for controlling the distance that one of said shuttles protrudes above said top surface.

5. The fixture of claim 1 wherein said substrate further comprises:

a coplanar waveguide (CPW) located on a CPW substrate that is located on said top surface for receiving a signal, said CPW directing said signal to at least one of said leads.

6. The fixture of claim 5 wherein said CPW comprises:

a CPW trace, said CPW trace having a proximal CPW trace end, a distal CPW trace end, a first CPW side and a second CPW side, said distal CPW trace end being connected to said proximal CPW trace end by said first CPW side and said second CPW side, wherein one of said contact flippers is connected to said proximal CPW trace end of said CPW trace;

a first gap extending along the length of said first CPW side, said first gap having a first width;

a second gap extending along the length of said second CPW side, said second gap having a second width; and ground traces extending along the length of said first gap and said second gap, wherein impedance of said fixture is controlled by said first width of said first gap and said second width of said second gap.

7. The fixture of claim 5 wherein said CPW comprises:

a CPW trace, said CPW trace having a proximal CPW trace end, a distal CPW trace end, a first CPW side and a second CPW side, said distal CPW trace end being connected to said proximal CPW trace end by said first CPW side and said second CPW side, wherein one of said contact flippers is connected to said proximal CPW trace end of said CPW trace;

a single gap extending along the length of either one of said first CPW side or said second CPW side; and a ground trace extending along the length of said single gap on the side opposite said first CPW side or said second CPW side.

8. The fixture of claim 6, wherein said fixture further comprises:

a ground plane surrounding said plurality of traces for connecting to at least one of said traces.

9. The fixture of claim 8, wherein said ground traces comprise connecting several of the plurality of traces to said ground plane.

10. The fixture of claim 8, wherein said ground traces comprise connecting several of the plurality of traces to capacitors that are connected to said ground plane.

11. The fixture of claim 5 further comprising a means for transferring said signal to said CPW.

12. The fixture of claim 11 wherein said transferring means is a coaxial cable having outer and inner conductors, said outer conductor connecting to said ground plane and said inner conductor connecting to at least one of said traces.

13. The fixture of claim 11 wherein said transferring means is a microstrip.

14. The fixture of claim 11 wherein said transferring means is a CPW in a second planar printed circuit board.

* * * * *